US006559678B1

United States Patent
Callahan

(10) Patent No.: US 6,559,678 B1
(45) Date of Patent: May 6, 2003

(54) NODE PREDISPOSITION CIRCUIT

(75) Inventor: John M. Callahan, San Ramon, CA (US)

(73) Assignee: Nanoamp Solutions, Inc., San Jose, CA (US)

( * ) Notice: Subject to any disclaimer, the term of this patent is extended or adjusted under 35 U.S.C. 154(b) by 0 days.

(21) Appl. No.: 10/036,312

(22) Filed: Dec. 24, 2001

(51) Int. Cl.[7] .................. H03K 19/00; H03K 19/175
(52) U.S. Cl. ............................ 326/93; 326/83
(58) Field of Search .................. 326/93, 95–98, 326/83, 81–82, 86–87, 26–28

(56) References Cited

U.S. PATENT DOCUMENTS 5,377,149 A * 12/1994 Gaultier ................. 326/112
5,420,525 A * 5/1995 Maloberti et al. ........ 326/27
5,450,019 A * 9/1995 McClure et al. ......... 326/121
5,698,994 A * 12/1997 Tsuji ......................... 326/17

FOREIGN PATENT DOCUMENTS

JP          05206830 A   *  8/1993  ....... H03K/19/0175

* cited by examiner

*Primary Examiner*—Don Le
*Assistant Examiner*—James H Cho
(74) *Attorney, Agent, or Firm*—Patrick T. King; Law Offices of Patrick T. King

(57) ABSTRACT

A node predisposition circuit for driving an output node of an output buffer circuit is provided which is formed of a delay circuit, a pre-charge pull-up circuit, and a pre-charge pull-down circuit. The pre-charge pull-up and pull-down circuits are used for pre-charging the output node to approximately one-half of the power supply voltage with a single phase system. The predisposition circuit has significantly reduced supply bounce and ground bounce, but yet maintains a high speed of operation with minimal static current.

19 Claims, 2 Drawing Sheets

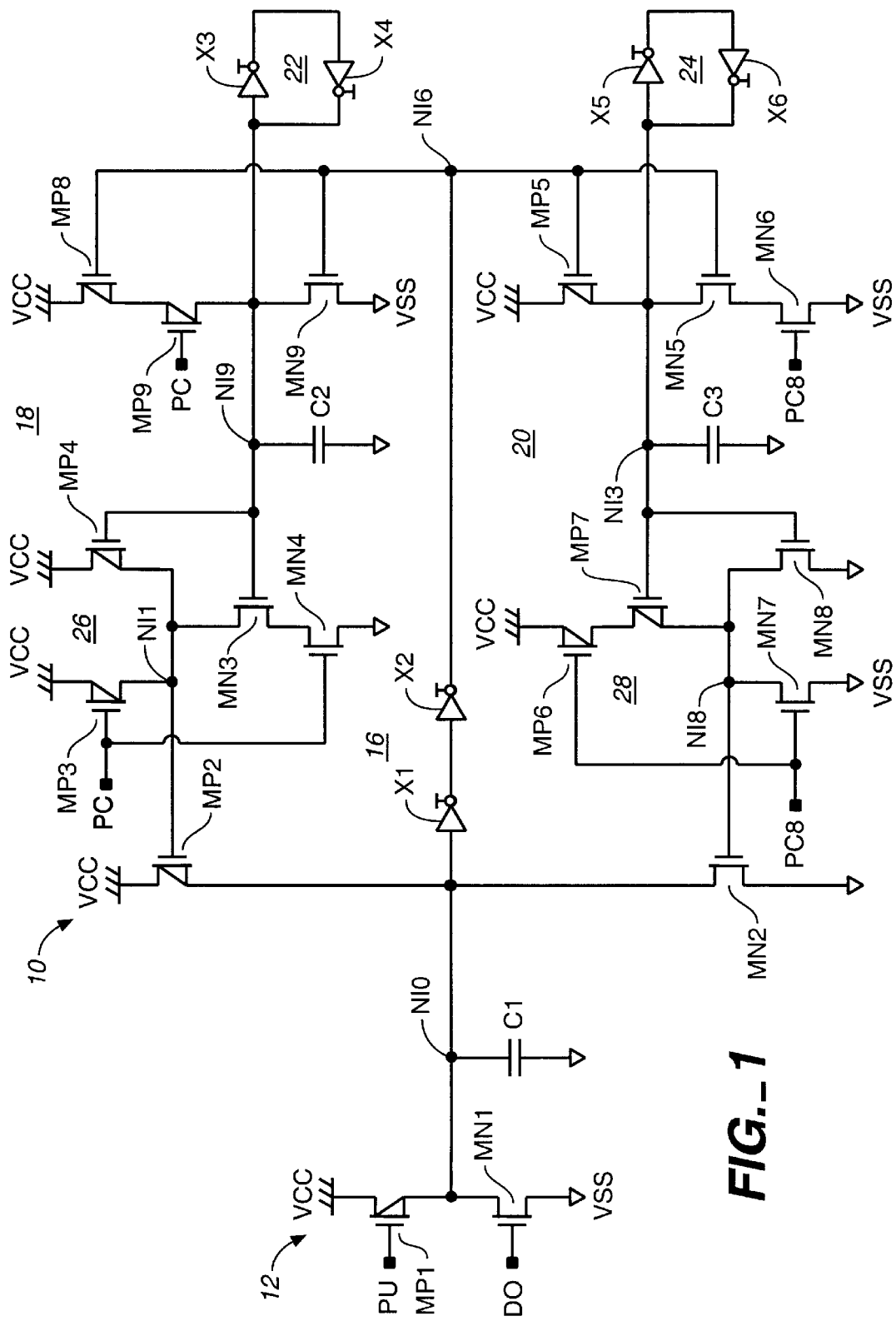
FIG._1

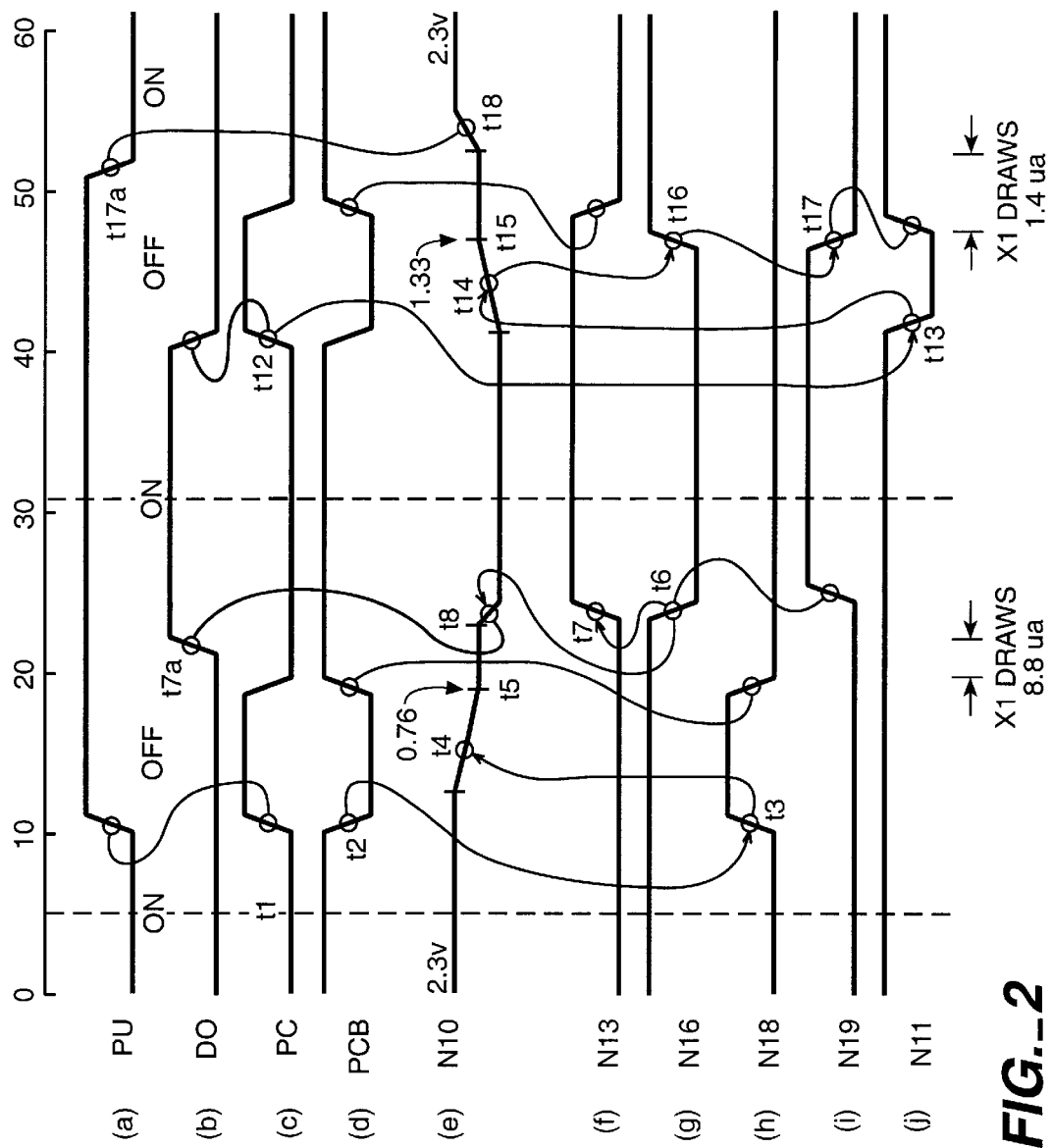
FIG._2

NODE PREDISPOSITION CIRCUIT

BACKGROUND OF THE INVENTION

1. Field of the Invention

This invention relates generally to output buffer or driver circuits. More particularly, it relates to a node predisposition circuit for driving an output node to either a high or low level with high speed but yet with significantly reduced supply bounce and ground bounce.

2. Prior Art

As is generally well-known in the art, output buffer or driver circuits are commonly used in digital circuits to provide a means for rapidly charging or discharging an output load (i.e., data bus) to a low (logic "0") or high (logic "1") level. When the output buffer circuit is implemented in metal oxide semiconductor (MOS) process technology, the output buffer is commonly formed of a PMOS pull-up transistor device and an NMOS pull-down transistor device connected series between a first power supply with a positive potential VCC and a second power supply with a ground potential VSS. The connection point of the pull-up and pull-down devices is further joined to an output node.

Dependent upon the logic state of a data input signal, either the pull-up or pull-down transistor device is quickly turned ON and the other is turned OFF. Typically, when such rapid switching ON and OFF of the pull-up and pull-down transistor devices occur this results in sudden surges of current creating what is sometimes referred to as current spikes. When the connection point of the pull-up and pull-down devices is making a high-to-low transition, damped oscillation or ringing will appear at the output node referred to as "ground bounce". Similarly, when the connection point is making a low-to-high transition damped oscillation or ringing will appear at the output node referred to as "supply bounce".

Various approaches have been made in the prior art of output buffer circuit design for minimizing the undesired supply bounce and ground bounce without sacrificing the need for high-speed of operation. One previous technique known heretofore involves the method of pre-charging the output node to one-half of the power supply voltage VCC or VCC/2. To this end, analog circuits were utilized in conjunction with bias circuits. Although this prior art method performed satisfactorily in reducing, supply bounce and ground bounce, it suffered from the disadvantage of creating excessive static currents. In a second prior art technique, there was provided a two-phase clocking system (i.e., phase I and phase II) for eliminating or removing of the excessive static currents. However, this second prior art method was not without problems since it generated a momentary current spike through the pre-charging pull-up and pull-down devices. This momentary current spike becomes magnified in a typical memory integrated circuit chip which has as many as 16 output buffer circuits. As a consequence, the momentary current spike will be multiplied 16 times, thereby producing on the order of tens of milliamps where the switching speed is in the order of nanoseconds. This will result in a supply bounce or ground bounce voltage of several volts causing interfacing problems among the output buffer and other I.C. devices connected to the same data bus.

The present invention represents a significant improvement over the two above-described prior art methods and provides a node predisposition circuit for driving an output node of an output buffer circuit to either a high or low level with a high speed of operation but with significantly reduced supply bounce and ground bounce. This is achieved by a pre-charge pull-up circuit for generating a transition from a low logic level to an intermediate level at the output node and a pre-charge pull-down circuit for generating a transition from a high logic level to the intermediate level at the output node which utilizes a single phase system.

SUMMARY OF THE INVENTION

Accordingly, it is a general object of the present invention to provide a node predisposition circuit for driving an output node of an output buffer circuit with significantly reduced supply bounce and ground bounce which is relatively simple in its construction, but yet overcomes the disadvantages of the prior art.

It is an object of the present invention to provide a node predisposition for driving an output node of an output buffer circuit which has a significant reduction in supply bounce and ground bounce.

It is another object of the present invention to provide a node predisposition circuit for driving an output node of an output buffer circuit which utilizes the technique of pre-charging the output node to one-half of the power supply potential with aa single phase system.

It is still another object of the present invention to provide a node predisposition circuit for driving an output node of an output buffer circuit which includes a delay circuit, a pre-charge pull-up circuit, and a pre-charge pull-down circuit.

In accordance with these and other objects of the invention, there is provided a node predisposition circuit for driving an output node of an output buffer with significantly reduced supply bounce and ground bounce which includes a delay circuit, a pre-charge pull-up circuit, and a pre-charge pull-down circuit. The delay circuit has its input connected to the output node of the output buffer circuit and has an output for generating a delayed signal. The pre-charge pull-up circuit is responsive to the delayed signal and a pre-charge signal for generating a transition from a low logic level to an intermediate level at the output node. The pre-charge pull-down circuit is responsive to the delayed signal and a complement pre-charge signal for generating a transition from a high logic level to the intermediate level at the output node.

The pre-charge pull-up circuit is formed of a first PMOS transistor, a second PMOS transistor, a first NMOS transistor, a NAND logic gate, and a pre-charge pull-up output transistor. The pre-charge pull-down circuit is formed of a third PMOS transistor, a second NMOS transistor, a third NMOS transistor, a NOR logic gate, and a pre-charge pull-down output transistor.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a schematic circuit diagram of a node predisposition circuit for use with an output buffer circuit, constructed in accordance with the principles of the present invention; and FIGS. 2(*a*) through 2(*j*) are a set of waveform diagrams showing the voltages at various nodes, useful in understanding the operation of the circuits in FIG. 1.

DETAILED DESCRIPTION OF THE PREFERRED EMBODIMENT

Reference is now made in detail to one preferred embodiment of the invention, an example of which is illustrated in the accompanying drawings. While the invention is described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

Referring now in detail to the drawings, there is shown in FIG. 1 a schematic circuit diagram of a node predisposition circuit 10 for use in conjunction with an output buffer circuit 12, constructed in accordance with the principles of the present invention. The node predisposition circuit 10 provides the capability of driving with a high speed of operation an output node or pad N10 connected to the output buffer circuit 12 but with significantly reduced supply bounce and ground bounce. The output buffer circuit 12 includes PMOS pull-up transistor MP1 and an NMOS pull-down transistor MN1. The transistor MP1 has its source connected to a power supply potential VCC, which is typically at +5.0 volts, and has its drain connected to output pad N10. The transistor MN1 has its drain connected also to the output pad N10 and its source connected to a ground potential VSS, which is typically at 0 volts. The output buffer circuit 12 provides an output signal to the output pad N10 in response to a first data input signal PU connected to the gate of the pull-up transistor MP1 and to a second data input signal DO connected to the gate of the pull-down transistor MN1. The output pad N10 is used to drive a capacitive load as represented by the capacitor C1.

The predisposition circuit 10 is comprised of a delay circuit 16, a pre-charge pull-up circuit 18, a pre-charge pull-down circuit 20, a first latch 22, and a second latch 24. The delay circuit is formed of a first inverter X1 and a second inverter X2. The first inverter X1 has its input connected to the output pad N10 and has its output connected to the input of the second inverter X2. The output of the second inverter X2 is connected to a node N16 for providing a delayed signal.

The pre-charge pull-up circuit 18 is comprised of a first PMOS transistor MP8, a second PMOS transistor MP9, a first NMOS transistor MN9, a capacitor C2, a NAND logic gate 26, and a pre-charge pull-up output PMOS transistor MP2. The first PMOS transistor MP8 has its source connected to the power supply potential VCC, its drain connected to the source of the second PMOS transistor MP9, and its gate connected to the gate of the first NMOS transistor MN9 at the node N16. The gate of the second PMOS transistor MP9 is connected to receive a pre-charge signal PC, and the source of the first NMOS transistor MN9 is connected to the ground potential VSS. The drain of the second PMOS transistor MP9 is connected to the drain of the first NMOS transistor MN9 and to one end of the capacitor C2 at a node N19. The other end of the capacitor C2 is connected to the ground potential.

The NAND logic gate 26 includes a pair of PMOS transistor MP3, MP4 and a pair of NMOS transistor MN3, MN4. The PMOS transistor MP3 has its source connected to the power supply potential and its gate connected to receive the pre-charge signal PC. The PMOS transistor MP4 has its source also connected to the power supply potential and its gate connected to the node N19 defining a first input of the NAND gate 26. The drains of the PMOS transistor MP3, MP4 are connected together and to a node N11 defining the output of the NAND gate 26. The NMOS transistor MN3 has its drain connected to the drains of the PMOS transistors MP3, MP4 at the node N11 and its source connected to the drain of the NMOS transistor MN4. The NMOS transistor MN4 has its source connected to the ground potential and its gate connected to the gate of the PMOS transistor MP3 defining a second input of the NAND gate 26.

The pre-charge pull-up output MP2 has its source connected also to the power supply potential and its gate connected to the node N11. The drain of the pull-up output transistor MP2 is connected to the output pad N10. The first latch 22 is formed of a third inverter X3 and a fourth inverter X4. The third inverter X3 has its input connected to output of the fourth inverter X4 and to the node N19 and has its output connected the input of the fourth inverter X4.

The pre-charge pull-down circuit 20 is comprised of a third PMOS transistor MP5, a second NMOS transistor MN5, a third NMOS transistor MN6, a capacitor C3, a NOR logic gate 28, and a pre-charge pull-down output NMOS transistor MN2. The third PMOS transistor MP5 has its source connected to the power supply potential VCC and its drain connected to the drain of the second NMOS transistor MN5 and to one end of the capacitor C3 at a node N13. The other end of the capacitor C3 is connected to the ground potential. The gate of the third PMOS transistor MP5 is connected to the gate of the second NMOS transistor MN5 at the node N16. The gate of the third NMOS transistor MN6 is connected to receive a complement pre-charge signal PCB, and the source of the third NMOS transistor MN6 is connected to the ground potential VSS. The drain of the third NMOS transistor MN6 is connected to the source of the second NMOS transistor MN5.

The NOR logic gate 28 includes a pair of PMOS transistors MP6, MP7 and a pair of NMOS transistor MN7, MN8. The PMOS transistor MP6 has its source connected to the power supply potential and its gate connected to receive the complement pre-charge signal PCB. The PMOS transistor MP7 has its source connected to the drain of the PMOS transistor MP6 and its gate connected to the gate of the NMOS transistor MN8 at the node N13 defining a first input of the NOR gate 28. The drain of the PMOS transistor MP7 is connected to the drains of the NMOS transistors MN7, MN8 at a node N18 defining the output of the NOR gate 28. The NMOS transistor MN7 has its gate connected to the gate of the PMOS transistor MP6 and its source connected to the ground potential. The drains of the NMOS transistors MN7, MN8 are connected together and to the node N18.

The pre-charge pull-down output MN2 has its source connected also to the ground potential and its gate connected to the node N18. The drain of the pull-down output transistor MN2 is connected to the output pad N10. The second latch 24 is formed of a fifth inverter X5 and a sixth inverter X6. The fifth inverter X5 has its input connected to output of the sixth inverter X6 and to the node N13 and has its output connected the input of the sixth inverter X6.

The operation of the node predisposition circuit 10 in conjunction with the output buffer circuit 12 of FIG. 1 will now be explained with reference to the waveform diagrams shown in FIGS. 2(a) through 2(j) which are useful in assisting in the understanding of the operation of the present invention. In particular, the pull-down action of the node predisposition circuit 10 will be first explained. Assume initially at time t1 that the output node or pad N10 is at a high level or logic "1", the pre-charge signal PC is at a low level or logic "0", and the complement pre-charge signal PCB is at a high level or logic "1". This causes the delayed signal at the node N16 to be also at the logic "1" state, which turns ON the transistor MN5. Since the transistor MN6 is also turned ON due to the complement pre-charge signal PCB being at the logic "1" state, the node N13 will be at the logic "0" state. Further, due to the fact that the gate of the transistor MN7 is at the logic "1" state it will be turned ON which causes the node N18 to be at the logic "0" state. As a result, the pre-charge pull-down transistor MN2 will turned OFF.

When the pre-charge signal makes a transition from the logic "0" state to a logic "1" state, the complement pre-charge signal PCB will make a transition from the logic "1" to the logic "0" state at time t2 (FIG. 2d). This will turn OFF the transistor MN7 and turn ON the transistor MP6 so as to cause the node N18 to go to the logic "1" state at time t3 (FIG. 2h). As a result, the pre-charge pull-down transistor MN2 will begin to pull down the output node N10 (FIG. 2e) at time t4. If the pre-charge time (i.e., PC=1) is long enough, the output node N10 will decrease to a voltage at time t5 which is low enough to cause the output of the inverter X1 to switch states, thereby causing the node N16 to go to the logic "0" state at time t6 (FIG. 2g). This will cause the transistor MP5 to turn ON so as to pull the node N13 (FIG. 2f) up to the logic "1" state at time t7. When this happens, the node N18 will go to a logic "0" state which turns OFF the pre-charge pull-down transistor MN2. Thus, the pre-charging of the output node N10 down from a logic "1" state will be terminated at an intermediate value at time t8.

It will be noted that this pre-charging time is from the time that it is sensed that an output signal is required to just prior to the time the actual memory data reaches the output buffer circuit 12. Since this is a relatively long time, this allows the output node N10 to be charged very slowly to the intermediate value of approximately one-half of the power supply potential or VCC/2. This is accomplished with the pre-charge pull-down output transistor MN2 which is made of smaller size dimensions than the pull-down transistor MN1 in the output buffer circuit 12, thereby reducing significantly the ground bounce.

During this pre-charging time, the pre-charge pull-up circuit 18 will be inactive. This is because at the time t1, prior to the pre-charging time, the output pad N10 and thus the node N16 will be at the high level which turns ON the transistor MN9. This keeps the node N19 (FIG. 2i) at the logic "0" state. Since the gate of the transistor MP4 is connected to the node N19, it will be turned ON which maintains the node N11 at the logic "1" state. Therefore, the pre-charge pull-up output transistor MP2 will be kept OFF.

When the pre-charge signal PC makes the low-to-high transition, the node N10 will be pulled down in the manner as was just described above; however, the node N16 will initially remain at the high level due to the delay circuit 16 (inverters X1, X2). As a consequence, the node N19 will be kept at the logic "0" state which causes the node N11 to remain at the logic "1" state. Thus, the pre-charge pull-up output transistor MP2 will not be rendered conductive during the pre-charging time which eliminates heavy static current from flowing through the pre-charge output transistors MP2 and MN2.

During the pre-charging time (PC=1), the pull-up data signal PU at the gate of the pull-up transistor MP1 in the output buffer circuit 12 is held to a logic "1" state and the pull-down data signal DO at the gate of the pull-down transistor MN1 is held at a logic "0" state. This is illustrated in FIGS. 2a and 2b, respectively. Just prior to the time t7a when the data signal DO arrives at the gate of the transistor MN1 of the output buffer circuit, the pre-charge signal PC goes to the logic "0" state so as to pull the output node N10 the rest of the way down to the logic "0" state for completion of the high-to-low transition.

It should be clear to those skilled in the art that the node N13 can only make a low-to-high transition during the pull-down action. Therefore, oscillation during the pull-down operation has been prevented. The second latch formed by the inverters X5, X6 serves to hold the voltage on the node N13 when it is floating. The capacitor C3 functions to maintain the voltage constant on the node N13 against fluctuations. The capacitor C3 may be suitable implemented with a gate oxide capacitor as is well known in the art.

Next, the pull-up action of the node predisposition circuit 10 will be explained. Assume initially at time t11 that the output node or pad N10 is at a low level or logic "0", the pre-charge signal PC is at a low level or logic "0", and the complement pre-charge signal PCB is at a high level or logic "1". This causes the delayed signal at the node N16 to be also at the logic "0" state, which turns ON the transistor MP8. Since the transistor MP9 is also turned ON due to the pre-charge signal PC being at the logic "0" state, the node N19 will be at the logic "1" state. Further, due to the fact that the gate of the transistor MP3 is at the logic "0" state it will be turned ON which causes the node N11 to be at the logic "1" state. As a result, the pre-charge pull-up tranistor MP2 will turned OFF.

When the pre-charge signal makes a transition from the logic "0" state to a logic "1" state at time t12 (FIG. 2c), this will turn ON the transistor MN4 and turn OFF the transistor MP3 so as to cause the node N11 to go to the logic "0" state at time t13 (FIG. 2j). As a result, the pre-charge pull-up transistor MP2 will begin to pull up the output node N10 (FIG. 2e) at time t14. If the pre-charge time (i.e., PC=1) is long enough, the output node N10 will increase to a voltage at time t15 which is high enough to cause the output of the inverter X1 to switch states, thereby causing the node N16 to go to the logic "1" state at time t16 (FIG. 2g). This will cause the transistor MP8 t6 turn OFF so as to pull the node N19 (FIG. 2i) down to the logic "0" state at time t17. When this happens, the node N11 will go to a logic "1" state which turns OFF the pre-charge pull-up transistor MP2. Thus, the pre-charging of the output node N10 up from a logic "0" state will be terminated at an intermediate value at time t18.

Similarly, it will be noted that this pre-charging time is from the time that it is sensed that an output signal is required to just prior to the time the actual memory data reaches the output buffer circuit 12. Since this is a relatively long time, this allows the output node N10 to be charged very slowly to the intermediate value of approximately one-half of the power supply potential or VCC/2. This is accomplished with the pre-charge pull-up output transistor MP2 which is made of smaller size dimensions than the pull-up transistor MP1 in the output buffer circuit 12, thereby reducing significantly the supply bounce.

During this pre-charging time, the pre-charge pull-down circuit 20 will be inactive. This is because at the time t11, prior to the pre-charging time, the output pad N10 and thus the node N16 will be at the low level which turns ON the transistor MP5. This keeps the node N13 (FIG. 2f) at the logic "1" state. Since the gate of the transistor MN8 is connected to the node N13, it will be turned ON which maintains the node N18 at the logic "0" state. Therefore, the pre-charge pull-down output transistor MN2 will be kept OFF.

When the pre-charge signal PC makes the low-to-high transition, the node N10 will be pulled up in the manner as was just described above; however, the node N16 will intially remain at the low level due to the delay circuit 16 (inverters X1, X2). As a consequence, the node N13 will be kept at the logic "1" state which causes the node N18 to remain at the logic "0" state. Thus, the pre-charge pull-down output transistor MN2 will not be rendered conductive during the pre-charging time which eliminates heavy static current from flowing through the pre-charge output transistors MP2 and MN2.

During the pre-charging time (PC=1), the pull-up data signal PU at the gate of the pull-up transistor MP1 in the output buffer circuit 12 is held to a logic "1" state and the pull-down data signal DO at the gate of the pull-down transistor MN1 is held at a logic "0" state. This is illustrated in FIGS. 2a and 2b, respectively. Just prior to the time t17a when the data signal PU arrives at the gate of the transistor MP1 of the output buffer circuit, the pre-charge signal PC goes to the logic "0" state so as to pull the output node N10 the rest of the way up to the logic "1" state for completion of the low-to-high transition.

Again, it should be clear to those skilled in the art that the node N19 can only make a high-to-low transition during the pull-up action. Therefore, oscillation during the pull-up operation has been prevented. The first latch formed by the inverters X3, X4 serves to hold the voltage on the node N19 when it is floating. The capacitor C2 functions to maintain the voltage constant on the node N19 against fluctuations. The capacitor C2 may be suitable implemented with a gate oxide capacitor as is well known in the art.

From the foregoing detailed description, it can thus be seen that the present invention provides a node predisposition circuit for driving an output node of an output buffer circuit which is formed of a delay circuit, a pre-charge pull-up circuit, and a pre-charge pull-down circuit. The predisposition circuit of the present invention has reduced supply bounce and ground bounce, but yet maintains a high speed of operation with minimal static current.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A node predisposition circuit for driving an output node of an output buffer circuit with significantly reduced supply bounce and ground bounce, comprising:

delay means having an input coupled to the output node of the output buffer circuit and an output for generating a delayed signal;

pre-charge pull-up means responsive to said delayed signal and a pre-charge signal for generating a transition from a low logic level to an intermediate level at the output node;

pre-charge pull-down means responsive to said delayed signal and a complement pre-charge signal for generating a transition from a high logic level to the intermediate level at the output node;

said pre-charge pull-up means including a first PMOS transistor, a second PMOS transistor, a first NMOS transistor, a NAND logic gate, and a pre-charge pull-up output transistor;

said first PMOS transistor having its source connected to a power supply potential, its drain connected to the source of said second PMOS transistor, and its gate connected to the gate of said first NMOS transistor and to the output of said delay means, said second PMOS transistor having its gate connected to receive the pre-charge signal, said first NMOS transistor having its source connected to a ground potential, said second PMOS transistor having its drain connected to the drain of said first NMOS transistor and to a first input of said NAND logic gate;

said NAND logic gate having a second input connected to receive also the pre-charge signal and its output connected to the gate of the pre-charge pull-up output transistor, said pre-charge pull-up output transistor having its source connected to the power supply potential and its drain connected to the output node;

said pre-charge pull-down means including a third PMOS transistor, a second NMOS transistor, a NOR logic gate, and a pre-charge pull-down output transistor;

said third PMOS transistor having its source connected the power supply potential and its gate connected to the gate of said second NMOS transistor and to the output of said delay means, said third PMOS transistor having its drain connected to the drain of said second NMOS transistor and to a first input of said NOR logic gate, said second NMOS transistor having its source connected to the drain of said third NMOS transistor, said third NMOS transistor having its source connected to the ground potential and its gate connected to receive the complement pre-charge signal; and said NOR logic gate having its second input connected to receive also complement pre-charge signal and its output connected to the gate of the pre-charge pull down output transistor, said pre-charge pull-down output transistor having its drain connected to the output node and its drain connected the ground potential, whereby the output node is either slowly pre-charged up to the intermediate level or slowly pre-charged down to the intermediate level so as to reduce supply bounce and ground bounce during completion of the respective low-to-high transition or high-to low transition at the output node.

2. A node predisposition circuit as claimed in claim 1, wherein said delay means terminates the pre-charging of the output node up to the intermediate level or down to the intermediate level.

3. A node predisposition circuit as claimed in claim 1, wherein said delay means is comprised of two-series connected inverters.

4. A node predisposition circuit as claimed in claim 1, wherein said pre-charge pull-up output transistor is a PMOS transistor.

5. A node predisposition circuit as claimed in claim 4, wherein said pre-charge pull-down output transistor is an NMOS transistor.

6. A node predisposition circuit as claimed in claim 1, wherein said pre-charge pull-up and pull-down transistors are dimensioned so as to be smaller in size than respective pull-up and pull-down devices in the output buffer circuit.

7. A node predisposition circuit as claimed in claim 1, further comprising a first capacitor having its one end connected to the first input of said NAND logic gate and its other end connected to the ground potential.

8. A node predisposition circuit as claimed in claim 7, further comprising a second capacitor having its one end connected to the first input of said NOR logic gate and its other end connected to the ground potential.

9. A node predisposition circuit as claimed in claim 1, further comprising first latch means connected to the first input of said NAND logic gate for maintaining its value.

10. A node predisposition circuit as claimed in claim 9, further comprising second latch means connected to the first input of said NOR logic gate for maintaining its value.

11. A node predisposition circuit as claimed in claim 10, wherein said first latch means is formed of a first inverter and a second inverter, said first inverter having its input connected to the first input of said NAND logic gate and its output connected to the input of said second inverter, said second inverter having its output connected to the input of said first inverter.

12. A node predisposition circuit as claimed in claim 11, wherein said second latch means is formed of a third inverter and a fourth inverter, said third inverter having its input connected to the first input of said NOR logic gate and its output connected to the input of said fourth inverter, said fourth inverter having its output connected to the input of said third inverter.

13. A node predisposition circuit for driving an output node of an output buffer circuit with significantly reduced supply bounce and ground bounce, comprising in combination:

an output buffer circuit including a pull-up device and a pull-down device connected together in series, the common point being connected to an output node;

delay means having an input coupled to the output node of the output buffer circuit and an output for generating a delayed signal;

pre-charge pull-up means responsive to said delayed signal and a pre-charge signal for generating a transition from a low logic level to an intermediate level at the output node;

pre-charge pull-down means responsive to said delayed signal and a complement pre-charge signal for generating a transition from a high logic level to the intermediate level at the output node;

said pre-charge pull-up means including a first PMOS transistor, a second PMOS transistor, a first NMOS transistor, a NAND logic gate, and a pre-charge pull-up output transistor;

said first PMOS transistor having its source connected to a power supply potential, its drain connected to the source of said second PMOS transistor, and its gate connected to the gate of said first NMOS transistor and to the output of said delay means, said second PMOS transistor having its gate connected to receive the pre-charge signal, said first NMOS transistor having its source connected to a ground potential, said second PMOS transistor having its drain connected to the drain of said first NMOS transistor and to a first input of said NAND logic gate;

said NAND logic gate having a second input connected to receive also the pre-charge signal and its output connected to the gate of the pre-charge pull-up output transistor, said pre-charge pull-up output transistor having its source connected to the power supply potential and its drain connected to the output node;

said pre-charge pull-down means including a third PMOS transistor, a second NMOS transistor, a third NMOS transistor, a NOR logic gate, and a pre-charge pull-down output transistor;

said third PMOS transistor having its source connected the power supply potential and its gate connected to the gate of said second NMOS transistor and to the output of said delay means, said third PMOS transistor having its drain connected to the drain of said second NMOS transistor and to a first input of said NOR logic gate, said second NMOS transistor having its source connected to the drain of said third NMOS transistor, said third NMOS transistor having its source connected to the ground potential and its gate connected to receive the complement pre-charge signal; and said NOR logic gate having its second input connected to receive also the complement pre-charge signal and its output connected to the gate of the pre-charge pull-down output transistor, said pre-charge pull-down output transistor having its drain connected to the output node and its drain connected the ground potential, whereby the output node is either slowly pre-charged up to the intermediate level or slowly pre-charged down to the intermediate level so as to reduce supply bounce and ground bounce during completion of the respective low-to-high transition or high-to low transition at the output node.

14. A node predisposition circuit as claimed in claim 13, wherein said delay means terminates the pre-charging of the output node up to the intermediate level or down to the intermediate level.

15. A node predisposition circuit as claimed in claim 13, wherein said delay means is comprised of two-series connected inverters.

16. A node predisposition circuit as claimed in claim 13, wherein said pre-charge pull-up output transistor is a PMOS transistor.

17. A node predisposition circuit as claimed in claim 16, wherein said pre-charge pull-down output transistor is an NMOS transistor.

18. A node predisposition circuit as claimed in claim 13, wherein said pull-up device of the output buffer circuit is a PMOS transistor.

19. A node predisposition circuit as claimed in claim 18, wherein said pull-down device of the output buffer circuit is an NMOS transistor.

* * * * *